(12) United States Patent
Kartäusch et al.

(10) Patent No.: US 10,977,838 B2
(45) Date of Patent: Apr. 13, 2021

(54) METHOD FOR GENERATING A MAGNETIC RESONANCE IMAGE DATASET, COMPUTER PROGRAM PRODUCT, DATA STORAGE MEDIUM, AND MAGNETIC RESONANCE SYSTEM

(71) Applicant: Siemens Healthcare GmbH, Erlangen (DE)

(72) Inventors: Ralf Kartäusch, Erlangen (DE); Dominik Paul, Bubenreuth (DE); Flavio Carinci, Würenlingen (CH)

(73) Assignee: Siemens Healthcare GmbH, Erlangen (DE)

( * ) Notice: Subject to any disclaimer, the term of this patent is extended or adjusted under 35 U.S.C. 154(b) by 49 days.

(21) Appl. No.: 16/403,463

(22) Filed: May 3, 2019

(65) Prior Publication Data

US 2019/0340794 A1    Nov. 7, 2019

(30) Foreign Application Priority Data

May 4, 2018    (EP) .................................... 18170822

(51) Int. Cl.
*G06T 11/00*    (2006.01)
*G01R 33/56*    (2006.01)
*G01R 33/561*    (2006.01)

(52) U.S. Cl.
CPC ........ *G06T 11/005* (2013.01); *G01R 33/5608* (2013.01); *G01R 33/5617* (2013.01); *G06T 2211/424* (2013.01)

(58) Field of Classification Search
CPC ............. G06T 11/005; G06T 2211/424; G01R 33/5608; G01R 33/5617
See application file for complete search history.

(56) References Cited

U.S. PATENT DOCUMENTS

| | | | | |
|---|---|---|---|---|
| 7,285,954 B2* | 10/2007 | Nezafat | ............... | G01R 33/4824 324/307 |
| 7,535,222 B2* | 5/2009 | Bammer | ............ | G01R 33/4824 324/307 |
| 7,941,204 B1* | 5/2011 | Wang | ................. | G01R 33/5614 600/420 |
| 8,089,278 B1* | 1/2012 | Du | ..................... | G01R 33/4824 324/307 |
| 8,275,294 B2 | 9/2012 | Ikeda | | |

(Continued)

FOREIGN PATENT DOCUMENTS

DE    102013213940 B3    1/2015

OTHER PUBLICATIONS

Aelterman, Jan, et al. "Automatic high-bandwidth calibration and reconstruction of arbitrarily sampled parallel MRI." PloS one 9.6 (2014): e98937.

(Continued)

*Primary Examiner* — Dixomara Vargas
(74) *Attorney, Agent, or Firm* — Lempia Summerfield Katz LLC

(57) ABSTRACT

Generating a magnetic resonance image dataset includes providing a raw dataset that has been acquired such that the raw dataset is spatially and/or temporally undersampled. A regularization parameter is determined in an automated manner, and an image dataset is generated from the raw dataset using the regularization parameter in a compressed sensing technique.

17 Claims, 6 Drawing Sheets

(56) References Cited

U.S. PATENT DOCUMENTS

| | | | | |
|---|---|---|---|---|
| 8,354,844 | B2* | 1/2013 | Zaitsev | G01R 33/5611 324/307 |
| 8,618,797 | B2* | 12/2013 | Chen | G01R 33/5602 324/307 |
| 8,723,517 | B2* | 5/2014 | Takahashi | G01R 33/4641 324/307 |
| 8,879,852 | B2 | 11/2014 | Chang | |
| 9,002,430 | B2* | 4/2015 | Riederer | G01R 33/56366 600/419 |
| 9,035,653 | B2* | 5/2015 | Hutter | G01R 33/5611 324/309 |
| 9,274,197 | B2* | 3/2016 | Wang | G01R 33/561 |
| 9,396,562 | B2 | 7/2016 | Lefebvre | |
| 9,465,091 | B2* | 10/2016 | Riederer | G01R 33/4826 |
| 9,482,732 | B2* | 11/2016 | Chesneau | G01R 33/56509 |
| 9,507,003 | B2* | 11/2016 | Edelman | G01R 33/5635 |
| 9,784,812 | B2 | 10/2017 | Li | |
| 10,058,287 | B2* | 8/2018 | Meyer | A61B 5/055 |
| 10,197,656 | B2* | 2/2019 | Hilbert | G01R 33/5619 |
| 2007/0057671 | A1* | 3/2007 | Nezafat | G01R 33/4824 324/306 |
| 2008/0157767 | A1* | 7/2008 | Bammer | G01R 33/5616 324/312 |
| 2011/0148410 | A1* | 6/2011 | Zaitsev | G01R 33/5611 324/309 |
| 2012/0019243 | A1* | 1/2012 | Takahashi | G01R 33/4816 324/309 |
| 2012/0019244 | A1* | 1/2012 | Chen | G01R 33/5602 324/309 |
| 2013/0049752 | A1* | 2/2013 | Hutter | G01R 33/5611 324/309 |
| 2013/0123611 | A1* | 5/2013 | Riederer | A61B 5/0263 600/419 |
| 2014/0086469 | A1* | 3/2014 | Lefebvre | G01R 33/5611 382/131 |
| 2014/0126796 | A1* | 5/2014 | Chesneau | G01R 33/56308 382/131 |
| 2014/0152303 | A1* | 6/2014 | Wang | G01R 33/561 324/309 |
| 2015/0022207 | A1 | 1/2015 | Meyer | |
| 2015/0247910 | A1* | 9/2015 | Riederer | G01R 33/5619 324/309 |
| 2015/0285879 | A1* | 10/2015 | Hilbert | G01R 33/5619 324/309 |
| 2015/0346305 | A1* | 12/2015 | King | G01R 33/5611 324/309 |
| 2016/0146915 | A1 | 5/2016 | Mailhe | |
| 2017/0003363 | A1* | 1/2017 | Rosen | G01R 33/5614 |
| 2017/0089995 | A1* | 3/2017 | Basser | G01R 33/5608 |
| 2019/0147589 | A1* | 5/2019 | Zhou | G06T 5/50 382/131 |
| 2019/0154784 | A1* | 5/2019 | Polak | G01R 33/583 |

OTHER PUBLICATIONS

European Search Report for European Patent Application No. 18170822.3-1022 dated Dec. 7, 2018.

Hollingsworth, Kieren Grant. "Reducing acquisition time in clinical MRI by data undersampling and compressed sensing reconstruction." Physics in Medicine & Biology 60.21 (2015): R297.

Huang F, Chen Y: "Self-adjusted regularization ratio for robust compressed sensing"; Proceedings of the International Society for Magnetic Resonance in Medicine. (2009) pp. 4592.

Jaspan, Oren N., Roman Fleysher, and Michael L. Lipton. "Compressed sensing MRI: a review of the clinical literature." The British journal of radiology 88.1056 (2015): 20150487.

Khare, Kedar, et al. "Accelerated MR imaging using compressive sensing with no free parameters." Magnetic Resonance in Medicine 68.5 (2012): 1450-1457.

Kim, Sungheon G., et al. "Influence of temporal regularization and radial undersampling factor on compressed sensing reconstruction in dynamic contrast enhanced MRI of the breast." Journal of Magnetic Resonance Imaging 43.1 (2016): 261-269.

Lustig, Michael, David Donoho, and John M. Pauly. "Sparse MRI: The application of compressed sensing for rapid MR imaging." Magnetic Resonance in Medicine: An Official Journal of the International Society for Magnetic Resonance in Medicine 58.6 (2007): 1182-1195.

* cited by examiner

METHOD FOR GENERATING A MAGNETIC RESONANCE IMAGE DATASET, COMPUTER PROGRAM PRODUCT, DATA STORAGE MEDIUM, AND MAGNETIC RESONANCE SYSTEM

This application claims the benefit of EP 18170822.3, filed on May 4, 2018, which is hereby incorporated by reference in its entirety.

BACKGROUND

The present embodiments relate to generating a magnetic resonance image dataset.

Compared to other clinical imaging methods, magnetic resonance imaging has the advantage that magnetic resonance imaging does not use X-ray radiation and is able to image soft tissue.

In the early days, one disadvantage was comparatively extremely long measurement times of several minutes for a single image. The spin echo sequence and the gradient echo sequence were used as the imaging measurement sequences.

The first step towards reducing the measurement time involved optimizing and modifying the measurement sequences. For example, the flip angle of the excitation pulse was reduced in order to speed up the gradient echo sequence. This allowed a large reduction in the repetition time $T_R$, with the result that the measurement time for an image lasted just a matter of seconds. This sequence is also known by the acronym FLASH.

The spin echo sequence was accelerated by the repeated application of the refocusing pulse and subsequent readout of an echo signal. This sequence is known by the acronyms FSE, TSE or RARE.

Limits to any further acceleration achieved solely by modifying the measurement sequences are set by the Nyquist theorem. This states that the encoding in the direction of a dimension to be represented is to satisfy the following condition:

$$Dk < 2p/L,$$

where Dk is the spacing of the signals in k-space, and L is the extent of the object in the dimension to be represented.

Inverting the equation yields the region that may be imaged, also known as the field of view:

$$FoV = 2p/Dk.$$

Should a specific resolution be required (e.g., Dx in the x-direction), then data is to be acquired accordingly (e.g., subject to applying a certain maximum gradient moment $G_x$). The resolution decreases if fewer data points are acquired. If the gradient moment drops below $G_x$, which results in an increase in Dk, then aliasing artifacts arise.

The Nyquist theorem merely assumes that the signal to be sampled is band-limited. Any other prior knowledge is neither assumed nor used.

A signal or image S(t) in the spatial domain may be obtained from the acquired signal S(w) in k-space by a Fourier transform FT:

$$S(t) = 1/(2p)\int S(w)e^{iwt}dw.$$

This may also be expressed as:

$$S(t) = FT \cdot S(w). \quad (1)$$

There are many possible ways of using prior knowledge to circumvent the limit set by the Nyquist theorem.

A first approach is parallel imaging. This has two constituent parts. First, an undersampled dataset is acquired, albeit using a plurality of coils. An image dataset containing foldovers is obtained for each coil. Taking into account the sensitivity of the coils as prior knowledge, these images may be reconstructed into an image dataset that does not contain any foldovers. In SENSE-based reconstruction techniques, the unfolding takes place in image space; in GRAPPA-based reconstruction techniques, the unfolding takes place in k-space.

Thus, the first part of parallel imaging consists of the specific data acquisition; the second part consists of a specific reconstruction technique.

Another possible way of using prior knowledge and thus circumventing the limits of the Nyquist theorem is what is known as compressed sensing. This originates from Information Theory and was developed for photographic image datasets. The documents U.S. Pat. No. 8,879,852 B2, U.S. Pat. No. 9,784,812 B2, DE 102013213940 B3, US 20160146915 A1, U.S. Pat. No. 9,396,562 B2, and U.S. Pat. No. 8,275,294 B2 describe exemplary embodiments of methods that use compressed sensing.

The fundamental idea is based on exploiting the fact that when compressing images acquired in an uncompressed manner, this allows the image data to be displayed using few coefficients when a transform is applied. The JPEG2000 compression uses the wavelet transform.

If ultimately, however, some of the acquired data is not needed at all, this begs the question whether it is not possible to do without acquiring this portion of the data in the first place. The answer is yes, on certain conditions being satisfied.

One condition is that the signal is "sparse". This "sparsity" may exist from the outset. A known example is angiography datasets, for which the vessels occupy only a few pixels of the image, and the other image points, even if the other image points do not just include a noise signal, do not contain any relevant information.

The sparsity may also be produced by a transform, however. Many questions relate just to specific image regions or edges. Again, these occupy only a few pixels.

In compressed sensing, only some of the k-space lines are acquired. Instead of a full sample S(w), only a subsample $S_u(w)$ is available, and instead of a square Fourier matrix FT, only a partial matrix P is used:

$$S_u(w) = P \cdot S(t). \quad (2)$$

Therefore, inverting equation (2) does not produce a unique solution like equation (1) but generates a solution space U.

An optimization technique may be used in order to be able to select a solution in this solution space. One option is to select from the solution space the solution of minimum energy according to the Euclidean $l_2$ norm. This corresponds to minimizing:

$$\min \|S(t)\|_2 \text{ subject to } P \cdot S(t) = S_u(w)$$
$$S(t)$$

To simplify the calculation, it is also possible to shift to the $l_1$ norm:

$$\min \|S(t)\|_1 \text{ subject to } P \cdot S(t) = S_u(w)$$
$$S(t)$$

Since real data exhibits a noise signal, the condition is modified as follows:

$$\min \|S(t)\|_1 \text{ subject to } \|P \cdot S(t) - S_u(w)\|_2 \le e \quad (3)$$

S(t)

Writing equation (3) as an actual equality not as an inequality, and in Lagrange form, gives:

$$\mathrm{argmin}\|P\cdot S(t) - S_u(w)\|_2^2 + 1\|S(t)\|_1$$

S(t)

The parameter l is the regularization parameter and defines the ratio of data consistency to sparsity. If the parameter l is too high, although the noise signal is removed, too much image signal is provided. If the parameter l is too small, almost no noise signal is removed from the image.

The noise arises from the nature of the sampling. In compressed sensing, the k-space lines are acquired incoherently (e.g., in a random or pseudo-random manner). This provides that the k-space lines are acquired at irregular spacings. This prevents foldovers from occurring but lowers the SNR.

This noise resulting from the undersampling and the acquisition strategy is then removed again when the image dataset is generated.

Setting this regularization parameter is a process that requires a great deal of experience. The correct l depends, for example, also on the sparsity (e.g., the information content in the image).

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for generating a magnetic resonance image dataset that allows simpler compressed-sensing reconstruction is provided.

A method for generating a magnetic resonance image dataset includes providing a raw dataset that has been acquired such that the raw dataset is spatially and/or temporally undersampled. A regularization parameter is determined in an automated manner, and an image dataset is generated from the raw dataset using the regularization parameter in a compressed sensing technique.

As is well-known, in magnetic resonance imaging, it is not pixels that are acquired directly, as is the case in photography, for example, but echo signals or FIDs. These are also referred to as the raw dataset. Known reconstruction techniques may then be used to obtain image datasets from a raw dataset.

For a turbo spin echo TSE, the echo signals are to be rearranged, for example, before the echo signals may be Fourier transformed. Regridding may be performed for non-Cartesian k-space sampling.

For pseudo-random k-space sampling, a compressed-sensing reconstruction technique may be used to reconstruct an image dataset from the raw dataset or from an intermediate image dataset. Undersampling in the time dimension refers to when a plurality of image datasets represent different times during a movement or a state, and the measurement data that would be needed to satisfy the Nyquist theorem is omitted in this case. Spatial undersampling exists when insufficient k-space data is available for a single image dataset.

Undersampling may also exist in both the time dimension and spatial dimension at once.

A compressed-sensing reconstruction technique typically contains the elements of "transform sparsity" and a non-linear iterative reconstruction. In the "transform sparsity" act, the raw dataset or an intermediate image dataset is converted into a representation in which the relevant signal is "sparse".

Then the noise signal may be suppressed in the non-linear reconstruction process. The higher that a threshold value to be selected is set, the more noise signal, but also relevant signal, is removed. This may be controlled by the regularization parameter l. In order for the compressed-sensing reconstruction technique to work optimally and without error, the regularization parameter l is determined in an automated manner. "Determined in an automated manner" may provide that the numerical value of the regularization parameter need not be input with complete freedom. A completely free input, as disclosed in the prior art, is a numeric field, for example, in which the value of the regularization parameter is to be input. Alternatively, a completely free input may be performed using a slide control, for which the input is limited by merely a bottom and a top maximum value.

Determining in an automated manner may still allow a limited control facility by a user, but need not.

Thus, determining the regularization parameter is performed at least in part or entirely in a control device. The described equations are stored in a data storage device and may be used to calculate the regularization parameter using software.

Apart from defining the regularization parameter l, all the features that were described for the prior art in relation to compressed sensing still apply also to the method according to one or more of the present embodiments. For example, the k-space lines of the raw dataset may be acquired incoherently (e.g., in a random or pseudo-random manner).

The regularization parameter l may be determined from at least two echo signals. The echo signals may come from a reference measurement or from the raw dataset. Reference measurements are measurements for determining measurement parameters or correction factors.

The echo signals from a phase correction measurement may be used. This measurement is performed anyway and therefore does not require any extra effort.

Alternatively, the echo signals may be measured in a reference measurement. The reference measurement may have boundary conditions. For example, the echo signals may be acquired without phase encoding gradients.

In one embodiment, precisely two echo signals are used. Alternatively, precisely three echo signals are used. The regularization parameter l may be determined using just a small number of echo signals.

When using a plurality of receive coils, two or three measurement signals per receive coil are used.

In one embodiment, a signal amplitude of the echo signal may be used in each case. For example, the maximum signal amplitude of the echo signal may be used in each case to determine the regularization parameter. This usually lies in the center of the echo signal. Likewise, the signal amplitude in the center of k-space may be used.

Alternatively, a different reference value of the echo signals may also be used. For example, the area under the echo signal, the mean value of all the signal amplitudes of the echo signal, with the magnitude being used in each case, or the mean value of a certain number of signal amplitudes from the center of the echo signal may also be used.

In one embodiment, the echo signals may be acquired in an echo train (e.g., one single echo train). In one alternative, this may be acquired without a phase encoding gradient and hence without phase encoding. In this case, the echo signals represent the $T_2$ relaxation. In another alternative, a phase encoding gradient characteristic may be used. This may correspond to a phase encoding gradient characteristic used in the acquisition of the raw dataset.

For example, a TSE phase encoding gradient characteristic may be used. For TSE sequences, the k-space sampling may follow various schemes even for Cartesian sampling. In a first embodiment, "centered" k-space sampling may be performed. In this case, k-space is always sampled from the center outwards. Alternatively, "linear" k-space sampling may be performed. In this case, sampling starts at the edge of k-space and travels via the center outwards again. In another alternative, the sampling may start between a first edge and the center, and travel out via the other edge, and at the first edge contain the last echo signals.

In one embodiment, the arithmetic mean may be determined from at least two echo signals or their reference value.

In one embodiment, at least two echo signals or their reference values may be added. Added may be, for example, in the mathematical sense and include both summing and differencing.

In one embodiment, the mean value may be formed from the maximum signal amplitudes of the echo signals at the beginning and end of the echo train. The largest signal amplitude (e.g., of the echo signal from the center of k-space) is added to this mean value. If $I_{max\_A}$ is the signal amplitude of the first echo in the echo train, $I_{max\_B}$ is the signal amplitude of the last echo in the echo train, and $I_{max\_M}$ is the signal amplitude of the echo that has the largest signal amplitude in the echo train, then the regularization parameter l is given by:

$$l=l(I_{max\_M}+\tfrac{1}{2}(I_{max\_A}+I_{max\_B})). \tag{4}$$

Thus, the regularization parameter is determined according to (e.g., as a function of) $I_{max\_M}$, $I_{max\_A}$, and $I_{max\_B}$, with the mean value of $I_{max\_A}$ and $I_{max\_B}$ being used and added to $I_{max\_M}$ by a positive addition. In other words, the regularization parameter is a function of $I_{max\_M}$, $I_{max\_A}$ and $I_{max\_B}$. This definition of the regularization parameter may be employed when using a turbo spin echo as the imaging sequence.

The echo signals may be acquired using at least two different coils. Then, additionally or alternatively, the regularization parameter may be weighted according to the coil performing the acquisition:

$$l_{coil}=l(I_{max\_coil}). \tag{5}$$

This may be combined with the first embodiment, for example, by using each coil to acquire the echo train, and calculating the regularization parameter l in accordance with equation (4) for each coil.

Depending on the form of the reconstruction technique, for each raw dataset acquired by a coil, the associated regularization parameter $l_{coil}$ may be used. If the coils are used for parallel imaging, and an unfolded image is computed, it is also possible to determine a total regularization parameter for a number n of coils:

$$l_{coil}=1/n \cdot (a_1 l_{coil\_1}+a_2 l_{coil\_2}+ \ldots +a_n l_{coil\_n}), \tag{6}$$

where the coefficients a are weighting factors that represent the input to the overall image made by the individual coil signals.

Alternatively, a total regularization parameter may be obtained by calculating a root mean square of the signal amplitudes:

$$I_{coil\_total}=\mathrm{SQRT}(I_{max\_coil\_1}^2+I_{max\_coil\_2}^2+\ldots+I_{max\_coil\_n}^2) \tag{7 and}$$

then determining the total regularization parameter $l_{coil}$ according to the mean value $I_{coil\_total}$:

$$l_{coil}=l(I_{coil\_total}). \tag{8}$$

Alternatively or additionally, at least one of the echo signals may be acquired using a preparatory module. The regularization parameter is then given by $$l=l(I_{without}-I_{with}). \tag{9}$$

In this negative addition, the maximum signal intensities or another reference value of the echo signals are acquired once with a preparatory module and once without a preparatory module. The measurement without a preparatory module produces the maximum signal intensity $I_{without}$. The maximum signal intensity of the echo signal acquired with the preparatory module is $I_{with}$. The measurement data $I_{without}$ may come from a reference measurement without a preparatory module or from the measurement of the image data.

The ratio of a measurement with and without a preparatory module may be used as an alternative:

$$l=l(I_{without}/I_{with}). \tag{10}$$

It is possible to combine taking into account a preparatory module both with the acquisition of an echo train and with the use of a plurality of coils. Hence, the signal intensity obtained in equation (7) may be determined once with and once without a preparatory module, and these value are then used in equation (9).

According to another embodiment, a control panel is displayed to the user. A plurality of presets may be displayed as a picklist. The options "sharp", "medium", and "smooth" may be presented for selection Selecting the "sharp" option provides that then the automatically calculated regularization parameter l is converted according to:

$$l'=l/x \cdot l \tag{11}.$$

By selecting the "medium" option, the regularization parameter l may be left unchanged:

$$l'=l \tag{12}.$$

If, however, the "smooth" option is selected, the regularization parameter l' is set as:

$$l'=x \cdot l \tag{13}.$$

The conversion factor x may basically be set freely and may lie between 1 and 10. Despite the automated determination of the regularization parameter l, the user may thereby still influence the reconstruction of the image dataset without having to be concerned about the nature of the regularization parameter or even to know anything about it at all.

In a further alternative, the user may choose between a static measurement and a dynamic measurement, which corresponds to spatial or temporal undersampling. Then, an intermediate regularization parameter may be selected using a slide control, and, in the case of a static measurement, the regularization parameter may be obtained from:

$$l=z \cdot s \tag{14}$$

where z is freely selectable constant, and s is the value set on the slide control. In the case of a dynamic measurement, however, the regularization parameter l is defined as follows:

$$l=z \cdot \log(y \cdot s) \tag{15}$$

Again in this case, y and z are freely selectable constants, and s is the value set on the slide control.

In one embodiment, the raw dataset may be acquired using a plurality of coils. The raw dataset may then be undersampled even further than would have been possible with compressed sensing alone.

A turbo spin echo sequence may be used as the measurement sequence for acquiring the measurement dataset. Unlike the sequence described later, this sequence includes for the imaging also phase-encoding gradients.

Cartesian sampling of k-space may be used in the acquisition of the raw dataset. This is possible, for example, for spatial or static undersampling.

Alternatively, radial k-space sampling may be used in the acquisition of the raw dataset. This form of undersampling is for temporal undersampling. Individual spokes may be assigned to a plurality of raw datasets.

As a further alternative, spiral k-space sampling may be used in the acquisition of the raw dataset. Large accelerations in time may be achieved by spiral sampling.

The raw dataset may be undersampled in the spatial dimension (e.g., statically). The automatic definition of the regularization parameter is helpful for this form of undersampling.

As another example, a computer program product or a computer program that may be used to control a controller that controls an image generating unit of a magnetic resonance system to performs the aforementioned method is provided.

One or more of the present embodiments also relate to a data storage medium for a controller for controlling a data generating unit of a magnetic resonance system using data for performing the described method. The data generating unit may be an image generating unit.

In addition, one or more of the present embodiments relate to a magnetic resonance system including a controller. The magnetic resonance system is characterized in that the controller is configured to perform the method, as described.

The aforementioned methods may be implemented in the controller as software or even as (hard-wired) hardware.

Further embodiments of the magnetic resonance system correspond to the equivalent embodiments of the method. To avoid unnecessary repetition, reference is therefore made to the corresponding method features and corresponding advantages.

DETAILED DESCRIPTION

Figure 1:
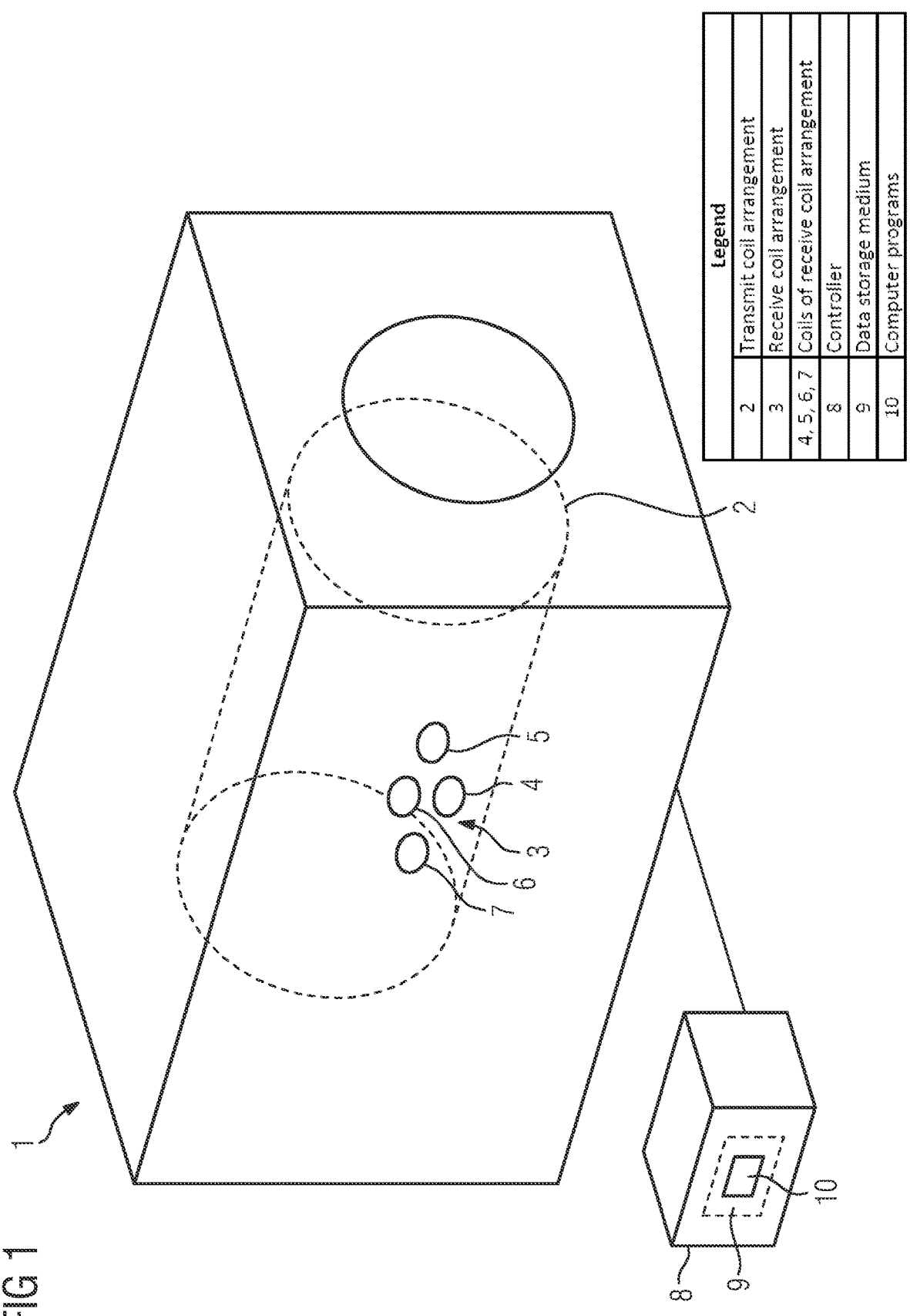
FIG. 1 shows one embodiment of a magnetic resonance system.

FIG. 1 shows one embodiment of a magnetic resonance system 1 including a transmit coil arrangement 2. The transmit coil arrangement 2 may be in the form of a body coil. The transmit coil arrangement 2 may also be a transmit coil array, however. The transmit coil arrangement 2 is shown dashed.

The magnetic resonance system 1 has a receive coil arrangement 3 for the purpose of data acquisition. The receive coil arrangement 3 may be a coil array including coils 4, 5, 6, and 7. The coils 4, 5, 6, and 7 read out measurement signals simultaneously and thus in parallel.

The magnetic resonance system 1 includes a controller 8 for controlling the trials.

The magnetic resonance system 1 also has a data storage medium 9 forming part of the controller 8 or separate therefrom, on which computer programs 10 are stored for performing magnetic resonance measurements.

Other parts of the magnetic resonance system 1, such as gradient coils or a patient couch, for example, are not shown for reasons of clarity.

Figure 2:
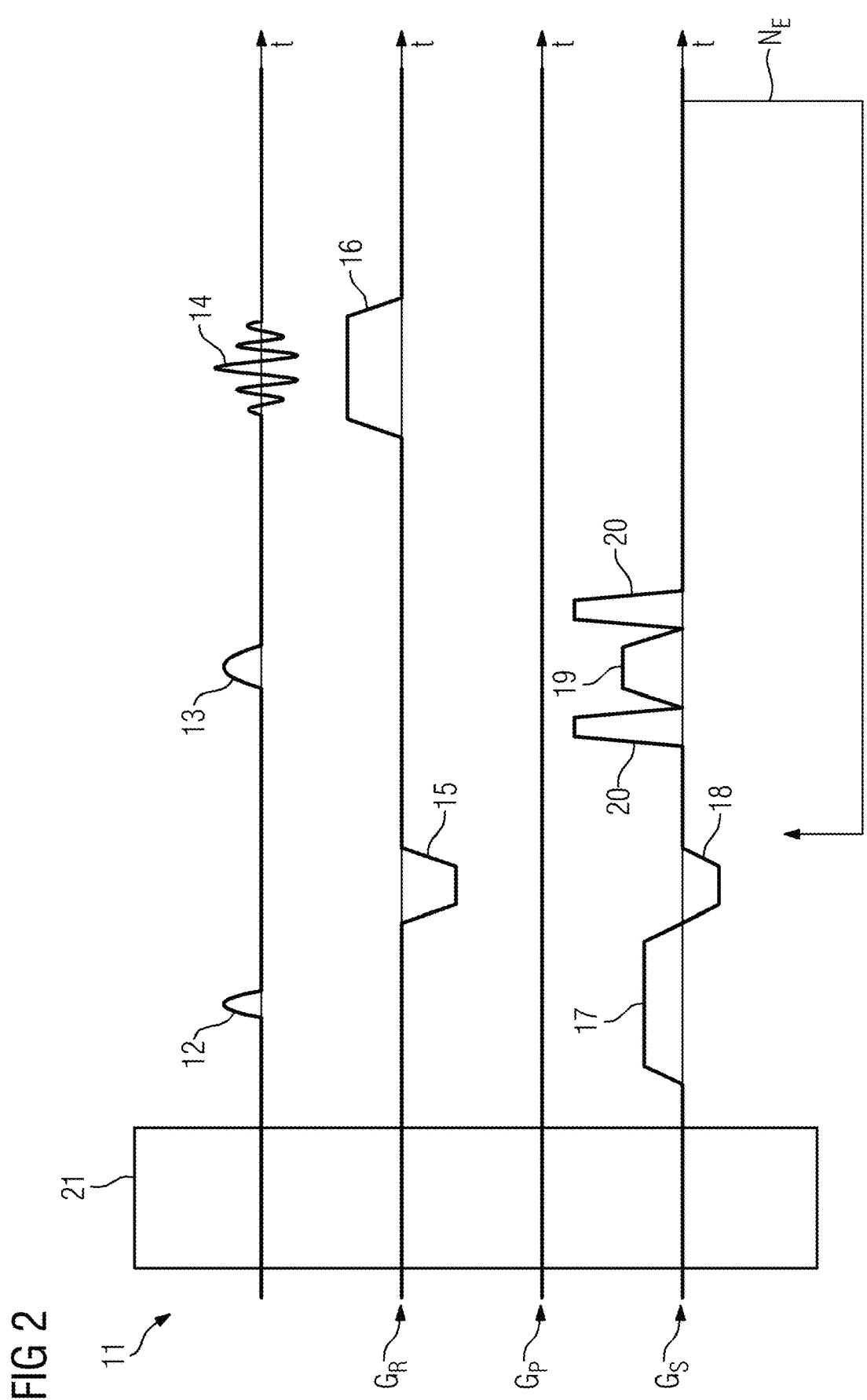
FIG. 2 shows an exemplary measurement sequence.

FIG. 2 shows a TSE measurement sequence diagram 11. The turbo spin echo sequence is used to acquire measurement signals for phase correction. The echo train containing a number $N_E$ of echoes is acquired without phase encoding and hence without gradients in the phase-encoding direction $G_P$.

ACQ denotes the axis for the radio frequency pulses and the acquisition windows. The radio frequency pulse may be, for example, a 90° pulse, and the refocusing pulse 13 may be, for example, a 180° pulse. These generate the echo signals 14.

A readout dephasing gradient 15 and readout gradients 16 are applied in the readout direction $G_R$.

In the slice selection direction $G_S$, a slice selection gradient 17, which is applied simultaneously with the radio frequency pulse 12, is followed by a slice rephasing gradient 18. The gradient moment of the slice rephasing gradient 18 is typically half the of the slice selection gradient 17.

The slice selection gradient 19 is applied simultaneously with the refocusing pulse 13. Two spoiler gradients enclose this slice selection gradient. The spoiler gradients 20 are used to disrupt signal components that may arise as a result of imperfections in the refocusing pulse 13.

A preparatory module 21 may optionally be used before the radio frequency pulse 12.

Figure 3:
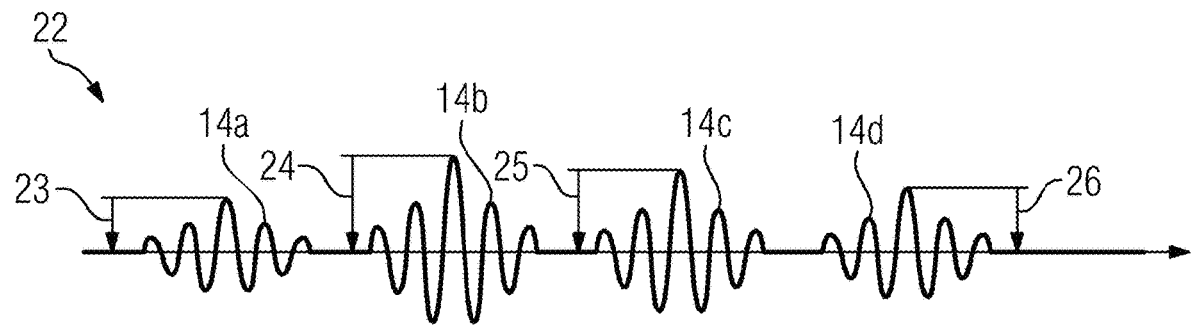
FIG. 3 shows an exemplary echo train.

FIG. 3 shows an echo train 22 such as may be obtained using the TSE sequence shown in FIG. 2. By way of example, the echo train 22 includes four echo signals 14a, 14b, 14c and 14d.

In this figure, the arrow 23 indicates the signal intensity or amplitude $I_{max\_A}$ of the first echo signal 14a; the arrow 26 indicates the signal amplitude $I_{max\_B}$ of the last echo signal 14d. The arrows 24 and 25 indicate the signal amplitudes of the echo signals 14b and 14c. The arrow 24 also indicates the signal amplitude $I_{max\_M}$, because by definition, this is the largest signal amplitude in the echo train 22.

From the TSE measurement sequence shown in FIG. 2, the regularization parameter l may thus be calculated in accordance with equation (4):

$$l = l(I_{max\_M} + \tfrac{1}{2}(I_{max\_A} + I_{max\_B})).$$

Figure 4:
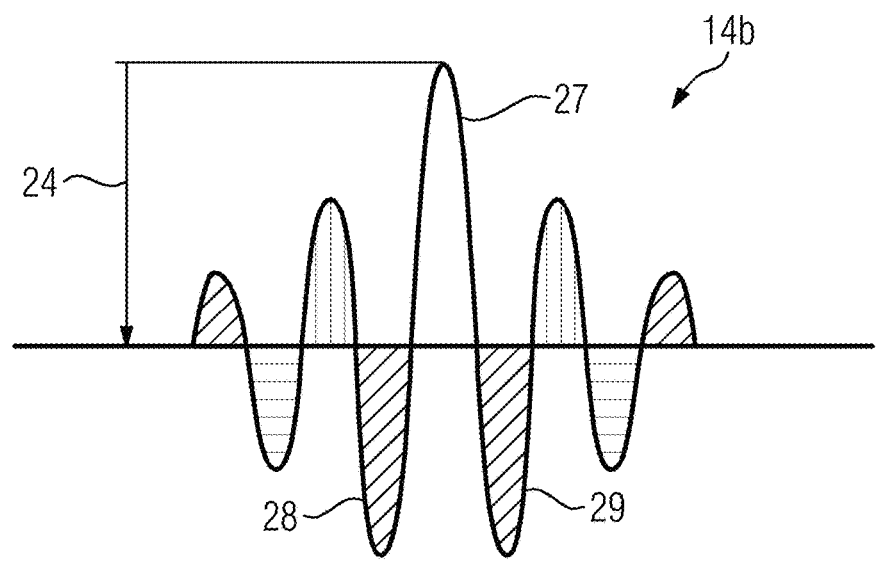
FIG. 4 shows an echo signal in a first embodiment.

FIG. 4 shows the echo signal 14b in magnified form. The aim of this is to illustrate a number of reference values that may be derived from the echo signal.

As already described above, the maximum amplitude $I_{max}$ of the echo signal 14b may be used. Alternatively, the area of the echo signal component 27 may be taken into account. As another alternative, further signal components such as the signal components 28 and 29 may also be incorporated. Thus, in general terms, the integral of a portion of the echo signal 14b may be used.

Although the reference value of the echo signals 14a, 14b, 14c, and 14d is freely selectable per se, the same reference value is to be selected for all the echo signals 14a, 14b, 14c, and 14d.

Figure 5:
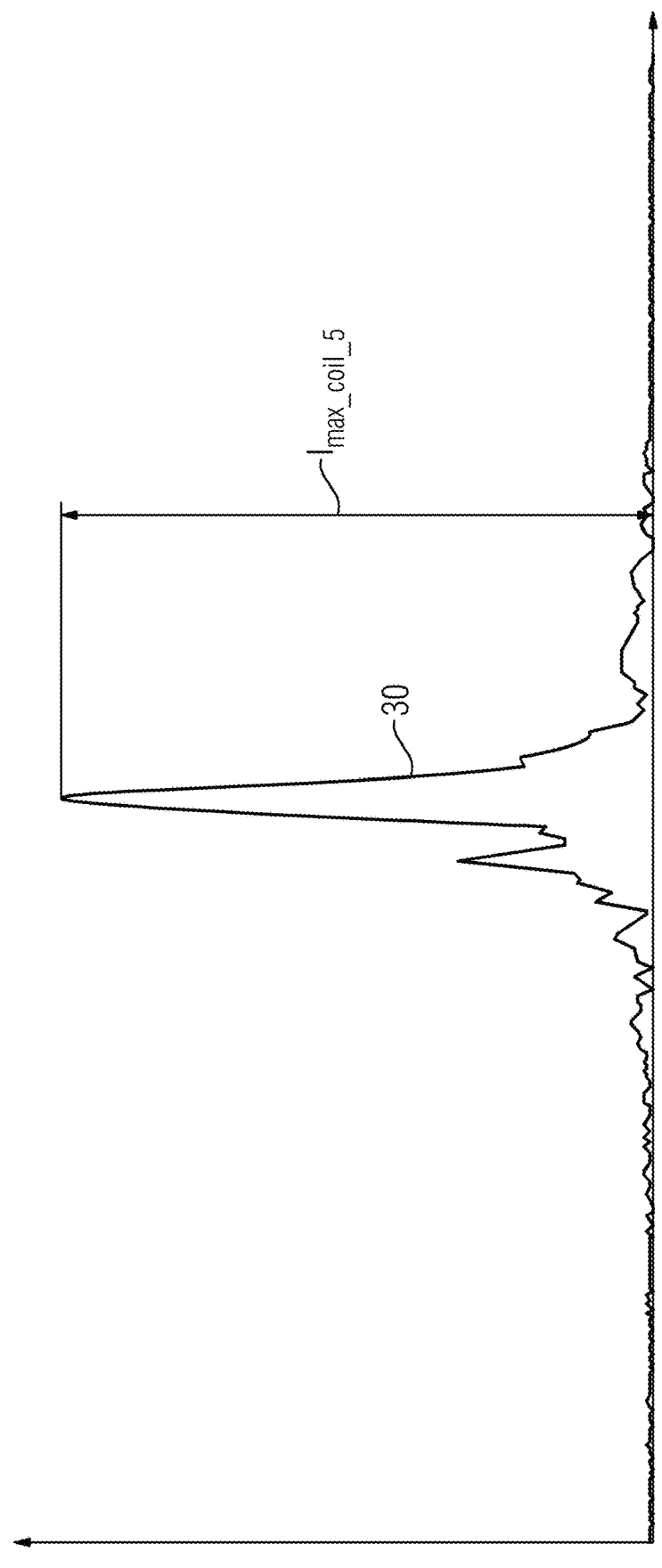
FIG. 5 shows an exemplary first spectrum.
Figure 6:
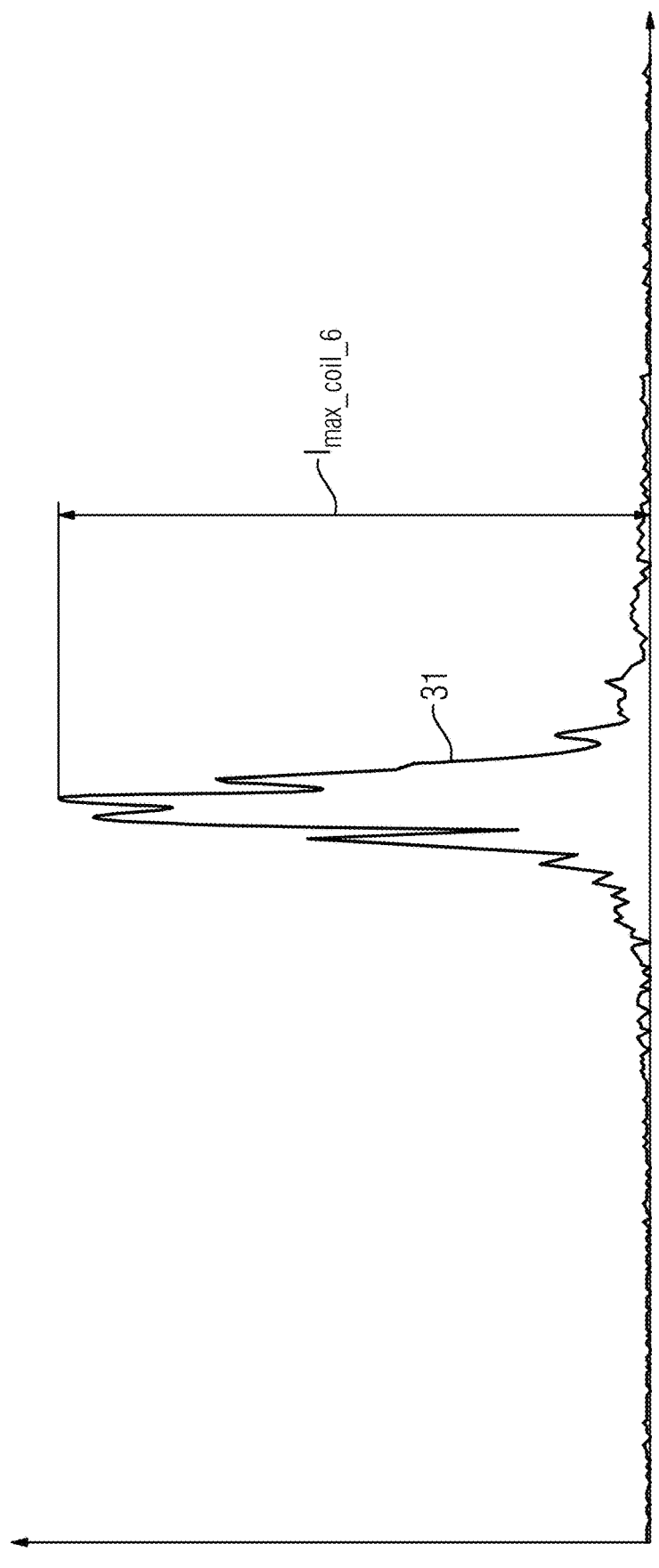
FIG. 6 shows an exemplary second spectrum.

FIGS. 5 and 6 show echo signals 30 and 31. In these figures, the echo signal 30 was acquired using the coil 5 and the echo signal 31 using the coil 6, for example. The echo signals may then be converted into a total signal in accordance with equation (7):

$$I_{total} = SQRT(I_{max\_coil\_4}^2 + I_{max\_coil\_5}^2 + I_{max\_coil\_6}^2 \cdot I_{max\_coil\_7}^2)$$

As explained with reference to FIG. 1, four receive coils 4, 5, 6, and 7 are assumed here purely by way of example. These also define the indices.

Each coil 4, 5, 6, and 7 may also measure an echo train 22 instead of single echo signals 30 and 31, and a reference amplitude may be determined for each coil in an analogous way to equation (4). This reference amplitude may then be incorporated in equation (7).

Figure 7:
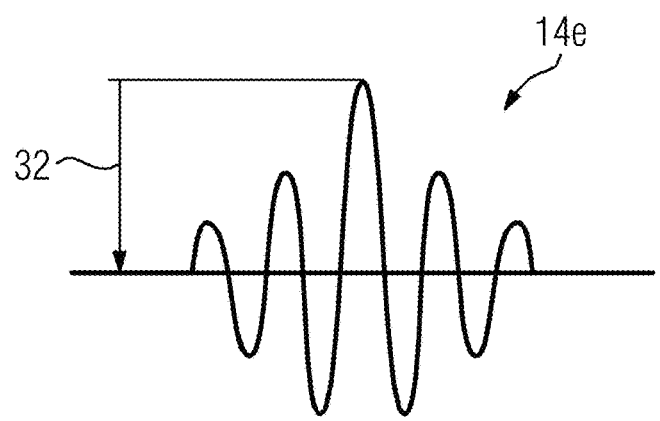
FIG. 7 shows an echo signal in a second embodiment.

FIG. 7 shows an echo signal 14e, which in terms of the acquisition, is comparable to the echo signal 14b. The difference is that the preparatory module 21 was applied before generating the echo signal 14e. This has resulted in a smaller signal amplitude $I_{max}$, represented by the arrow 32. The regularization parameter l may be determined in accordance with equation (9).

Figure 8:
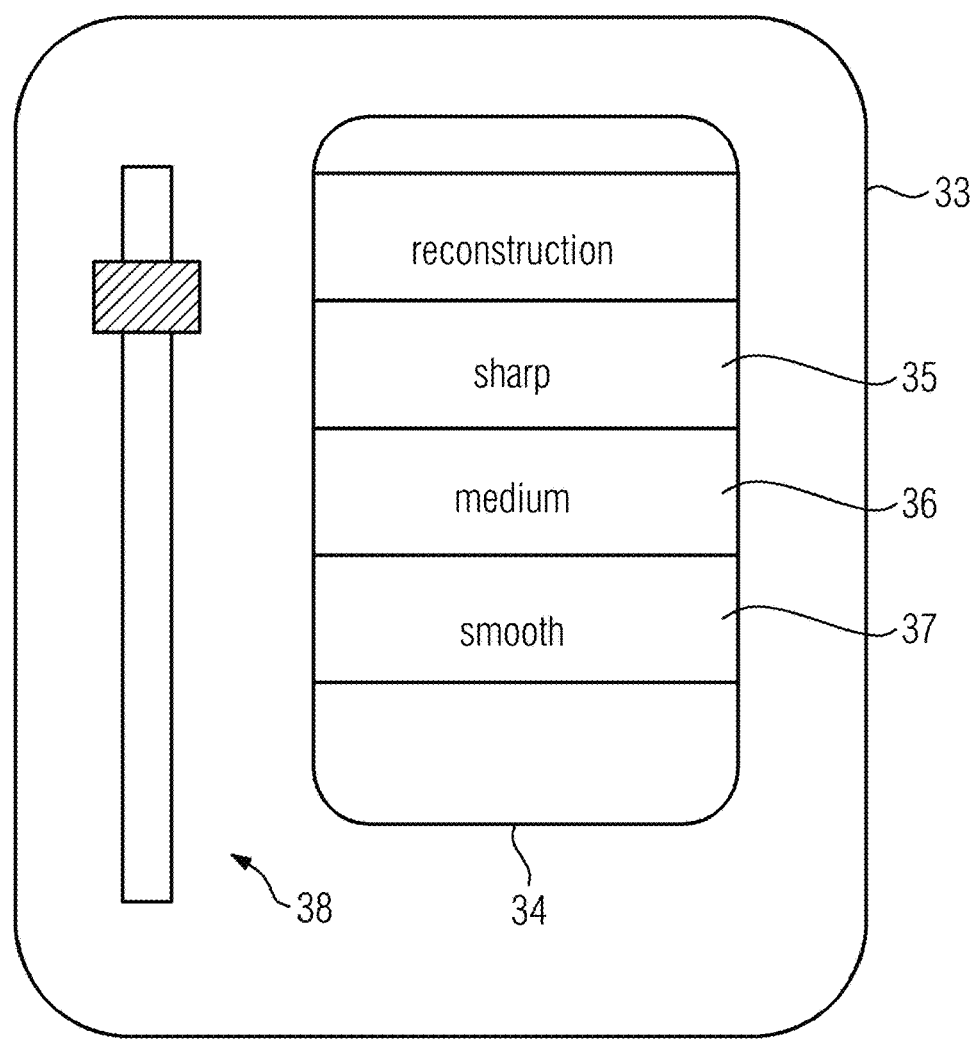
FIG. 8 shows one embodiment of a control panel.

FIG. 8 shows part of a control panel 33. This contains a drop-down menu 34 for modifying the regularization parameter l. The regularization parameter l is modified in accordance with one of the equations (11) to (13) depending on which of the selection fields 35, 36, or 37 is selected.

In addition, a slide control 38 may also be present for setting an initial value for the regularization parameter l.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating a magnetic resonance image dataset by a medical imaging apparatus, the method comprising:
providing a raw dataset that has been acquired by one or more coils of the medical imaging apparatus, such that the raw dataset is spatially, temporally, or spatially and temporally undersampled;
determining a regularization parameter in an automated manner, the regularization parameter defining a ratio of data consistency to sparsity; and
generating an image dataset from the raw dataset using the regularization parameter in a compressed sensing technique such that removal of noise in the image dataset is optimized.

2. The method of claim 1, wherein determining the regularization parameter comprises determining the regularization parameter from at least two echo signals.

3. The method of claim 2, further comprising acquiring the at least two echo signals in an echo train.

4. The method of claim 2, wherein determining the regularization parameter comprises determining the regularization parameter using a maximum signal amplitude of the at least two echo signals.

5. The method of claim 2, further comprising acquiring the at least two echo signals using at least two different coils of the one or more coils of the medical imaging apparatus.

6. The method of claim 2, wherein determining the regularization parameter comprises adding signal amplitudes.

7. The method of claim 2, wherein determining the regularization parameter comprises dividing two signal amplitudes.

8. The method of claim 2, further comprising acquiring at least one echo signal of the at least two echo signals using a preparatory module.

9. The method of claim 8, wherein acquiring the at least one echo signal using the preparatory module comprises acquiring one echo signal of the at least two echo signals using the preparatory module.

10. The method of claim 2, wherein determining the regularization parameter comprises forming an arithmetic mean of signal amplitudes.

11. The method of claim 2, wherein determining the regularization parameter comprises forming a root mean square of signal amplitudes of the at least two echo signals.

12. The method of claim 2, further comprising acquiring the at least two echo signals without a phase encoding gradient.

13. The method of claim 1, wherein the regularization parameter is changeable by reconstruction presets that are selectable in selection fields.

14. The method of claim 1, wherein the compressed sensing technique comprises a non-linear iterative reconstruction.

15. A non-transitory computer-readable storage medium that stores instructions executable by a controller to control a data generator of a magnetic resonance system for generating a magnetic resonance image dataset, the instructions comprising:
providing a raw dataset that has been acquired by one or more coils of the magnetic resonance system, such that the raw dataset is spatially, temporally, or spatially and temporally undersampled;
determining a regularization parameter in an automated manner, the regularization parameter defining a ratio of data consistency to sparsity; and
generating an image dataset from the raw dataset using the regularization parameter in a compressed sensing technique such that removal of noise in the image dataset is optimized.

16. The non-transitory computer-readable storage medium of claim 15, wherein the data generator comprises an image generator.

17. A magnetic resonance system comprising:
a controller configured to generate a magnetic resonance image dataset, the generation of the magnetic resonance image dataset comprising:
provision of a raw dataset that has been acquired by one or more coils of the magnetic resonance system, such that the raw dataset is spatially, temporally, or spatially and temporally undersampled;

determination of a regularization parameter in an automated manner, the regularization parameter defining a ratio of data consistency to sparsity; and generation of an image dataset from the raw dataset using the regularization parameter in a compressed sensing technique such that removal of noise in the image dataset is optimized.

* * * * *